United States Patent
Zhao et al.

(10) Patent No.: US 9,306,574 B1
(45) Date of Patent: Apr. 5, 2016

(54) CLOCK DIVIDER CIRCUIT WITH SYNCHRONIZED SWITCHING

(71) Applicant: Apple Inc., Cupertino, CA (US)

(72) Inventors: Feng Zhao, San Jose, CA (US); Raman S. Thiara, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/638,284

(22) Filed: Mar. 4, 2015

(51) Int. Cl.
 *H03K 21/00* (2006.01)
 *H03K 23/00* (2006.01)
 *H03K 25/00* (2006.01)
 *H03K 21/02* (2006.01)
 *H03K 3/037* (2006.01)
 *H03L 7/00* (2006.01)

(52) U.S. Cl.
 CPC ............. *H03K 21/026* (2013.01); *H03K 3/037* (2013.01); *H03L 7/00* (2013.01)

(58) Field of Classification Search
 USPC ......... 327/355–361, 202, 203, 208–212, 218, 327/105–123, 141, 144–163; 377/47, 48; 375/373–376
 See application file for complete search history.

(56) References Cited

U.S. PATENT DOCUMENTS

| | | | |
|---|---|---|---|
| 6,242,953 B1 | 6/2001 | Thomas | |
| 6,961,403 B1* | 11/2005 | Austin | G11C 19/00 327/115 |
| 7,113,009 B2 | 9/2006 | Sun et al. | |
| 2005/0212570 A1* | 9/2005 | Sun | H03K 21/08 327/115 |
| 2006/0164132 A1* | 7/2006 | Martin | H03L 7/081 327/105 |
| 2009/0322386 A1* | 12/2009 | Wu | H03K 23/68 327/117 |
| 2012/0194220 A1* | 8/2012 | Cavin | G06F 1/08 326/104 |
| 2014/0173324 A1 | 6/2014 | Dobbs et al. | |
| 2015/0207510 A1* | 7/2015 | Pace | H03K 21/10 377/47 |

* cited by examiner

*Primary Examiner* — Brandon S Cole
(74) *Attorney, Agent, or Firm* — Meyertons, Hood, Kivlin, Kowert & Goetzel, P.C.; Erik A. Heter (57) ABSTRACT

The clock divider circuit includes a dividing circuit, a selection circuit, and a synchronization circuit. The dividing circuit is configured to receive an input clock signal at a first frequency, and to produce a number of different periodic signals based thereon. The selection circuit is configured to receive various ones of the periodic signals. An output clock signal may be provided from the selection circuit based on a selection made therein. The input clock signal may have a frequency that is an integer multiple of the output clock frequency. The selection circuit is configured to provide the output clock signal at different, selectable frequencies. The synchronization circuit may control the timing of the switching of the output clock signal from one frequency to the next so that such switching may be performed without glitches.

20 Claims, 7 Drawing Sheets

CLOCK DIVIDER CIRCUIT WITH SYNCHRONIZED SWITCHING

BACKGROUND

1. Technical Field

This disclosure is directed to electronic circuits, and more particularly, clock divider circuits used to vary the frequency of a clock signal.

2. Description of the Related Art

Synchronous circuits implemented on an integrated circuit (IC) utilize a clock signal. Synchronous circuits such as flip-flops and other circuit types may change states responsive to an edge (e.g., a rising edge) of a received clock signal. Thus, such state changes may be controlled so that they are performed at certain times, thereby synchronizing the operation of the various circuits. This may be of particular importance in certain IC subsystems, such as data path subsystem.

In many ICs, some clock frequencies may be varied during operation for different reasons. For example, the frequency of a clock signal may be increased in order to enable higher performance (e.g., higher data throughput), or may be decreased in order to reduce power consumption. Various types of circuits may be used to accomplish frequency variation of clock signals. One such type of circuit is a clock divider. A clock divider may receive a clock signal at a first frequency and output a corresponding clock signal at a second frequency that is less than the first. For example, a clock divider may receive a clock signal having a frequency of 800 MHz, and may output a corresponding clock signal at a frequency of 400 MHz. Thus, the frequency of the input clock signal is divided by two in this example to produce the output clock signal at the reduced frequency.

SUMMARY

A clock divider circuit is disclosed. The clock divider circuit includes a dividing circuit, a selection circuit, and a synchronization circuit. The dividing circuit is configured to receive an input clock signal at a first frequency, and further configured to produce a number of different periodic signals based therein. The selection circuit is configured to receive various ones of the periodic signals. An output clock signal may be provided from the selection circuit based on a selection made therein. The input clock signal may have a frequency that is an integer multiple of the output clock frequency, with the selection circuit being configured to provide the output clock signal at different, selectable frequencies. The synchronization circuit may control the timing of the switching of the output clock signal from one frequency to the next so that such switching may be performed without glitches that, if allowed to propagate, could adversely affect operation of circuits receiving the output clock signal.

In one embodiment, a dividing circuit includes a first pair of serially-coupled latches and a second pair of serially-coupled latches. First logic circuitry is coupled to an input of a first one of the first pair of latches, with second logic circuitry being coupled between an output of a second one of the first pair of latches and an input to a first one of the second pair of latches. The dividing circuit is configured to generate a number of periodic signals. In one embodiment, the selection circuit is coupled to receive multiple ones of the periodic signals, with the synchronization circuit receiving another one of the periodic signals. The selection circuit in one embodiment includes a multiplexer and at least one logic circuit (e.g., an OR gate). One of the periodic signals may be provided to a first input of the multiplexer, while both of the periodic signals may be provided to the logic circuit, which in turn includes an output coupled to another input of the multiplexer. Based on a selection made by the multiplexer, the output clock signal is provided at a selected frequency that is a divided from the frequency of the input clock signal.

The synchronization circuit in one embodiment is configured to generate a multiplexer select signal and divisor select signals. The divisor select signals are provided to the divider circuit. Based on the received clock signal and divisor select signals, the divider circuit generates the periodic signals discussed above at frequencies that correspond to the selected divisor (e.g., 2, 3, etc.). The synchronization circuit is coupled to receive one of the periodic signals from the divider circuit, along with control signals from an external source. The control signals provide an indication to the synchronization circuit as to the divisor. The synchronization circuit is configured to generate the divisor select signals and multiplexer select signal at a certain timing in order to prevent the occurrence of glitches that can adversely affect the operation of circuit that receive the output clock signal. In one embodiment, the divisor select signals may be synchronized to a falling edge of a first periodic signal receive from the dividing circuit. The state of the multiplexer select signal may be changed responsive to, or after a rising edge of the first periodic signal.

BRIEF DESCRIPTION OF THE DRAWINGS

The following detailed description makes reference to the accompanying drawings, which are now briefly described.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/ circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

Figure 1:
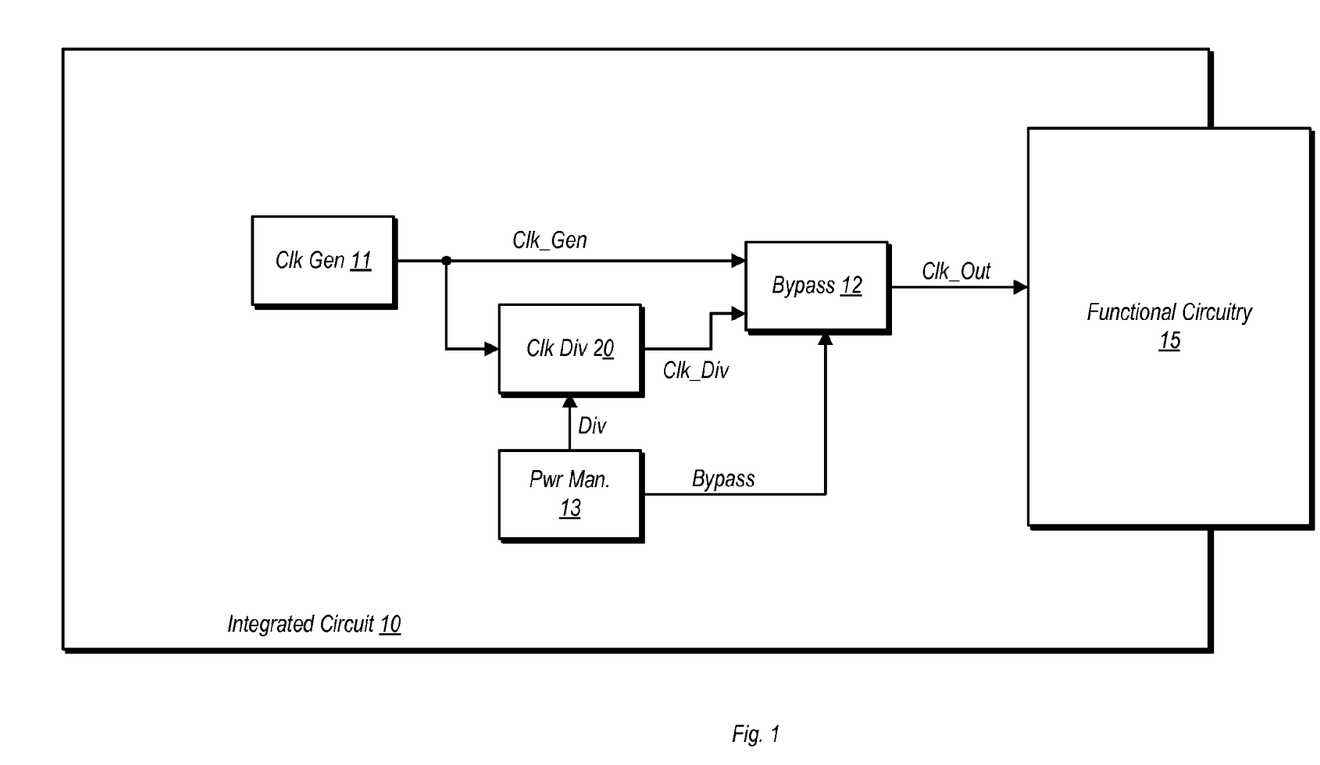
FIG. 1 is a block diagram of one embodiment of an integrated circuit.

Turning now to FIG. 1, a simplified block diagram of one embodiment of an integrated circuit (IC) is shown. In the embodiment shown, IC 10 includes a clock generator 11, a clock divider 20, a bypass circuit 12 (optional), a power management circuit 13, and functional circuitry 15. It is noted that the exemplary embodiment of IC 10 is shown here for illustrative purposes, and that a wide variety of IC embodiments fall within the scope of this disclosure.

Functional circuitry 15 in the embodiment shown is configured to perform the various intended functions of IC 10. Such functions may be implemented using various logic circuits. Many of the logic circuits may be sequential logic circuits that are synchronized to a received clock signal. In this particular example, the clock signal, clk_out, is received from bypass circuit 12.

Clock generator 11 may be any suitable type of clock generation circuit. Such circuits may include, but are not limited to, phase locked loops (PLLs), oscillators, and so on. Clock generator 11 may also include pulse shaping circuitry to enable the clock signal to be output at a particular duty cycle (e.g., 50%).

Clock divider 20 in the embodiment shown is coupled to receive the clock signal, Clk_Gen, provided by clock generator 11. The output clock signal, Clk_Div, from clock divider 20, may be provided at a frequency that is less than that of Clk_Gen. In one embodiment, clock divider 20 is configured to divide the frequency of the input clock signal by an integer divisor in order to produce a frequency-divided (i.e. reduced frequency) output signal. The divisor may be determined based on one or more control signals, Div, received from power management circuit 13. The frequency of the output clock signal, Clk_Div, may be changed for various reasons, e.g., increased for performance boosting, or reduced for power savings. As will be discussed below, clock divider 20 in various embodiments is configured for glitch-free switching between divisors so that operation of functional circuitry 15 is not adversely affected.

In the event that it is desired that the clock signal be provided at its full frequency, power management circuit 13 may assert the bypass signal, thereby causing the full frequency clock signal, Glk_Gen, output by clock generator 11, to be provided as Clk_Out. Otherwise, if the clock signals is to be provided at a reduced frequency, bypass circuit 12 provided Clk_Div as Clk_Out.

Figure 2:
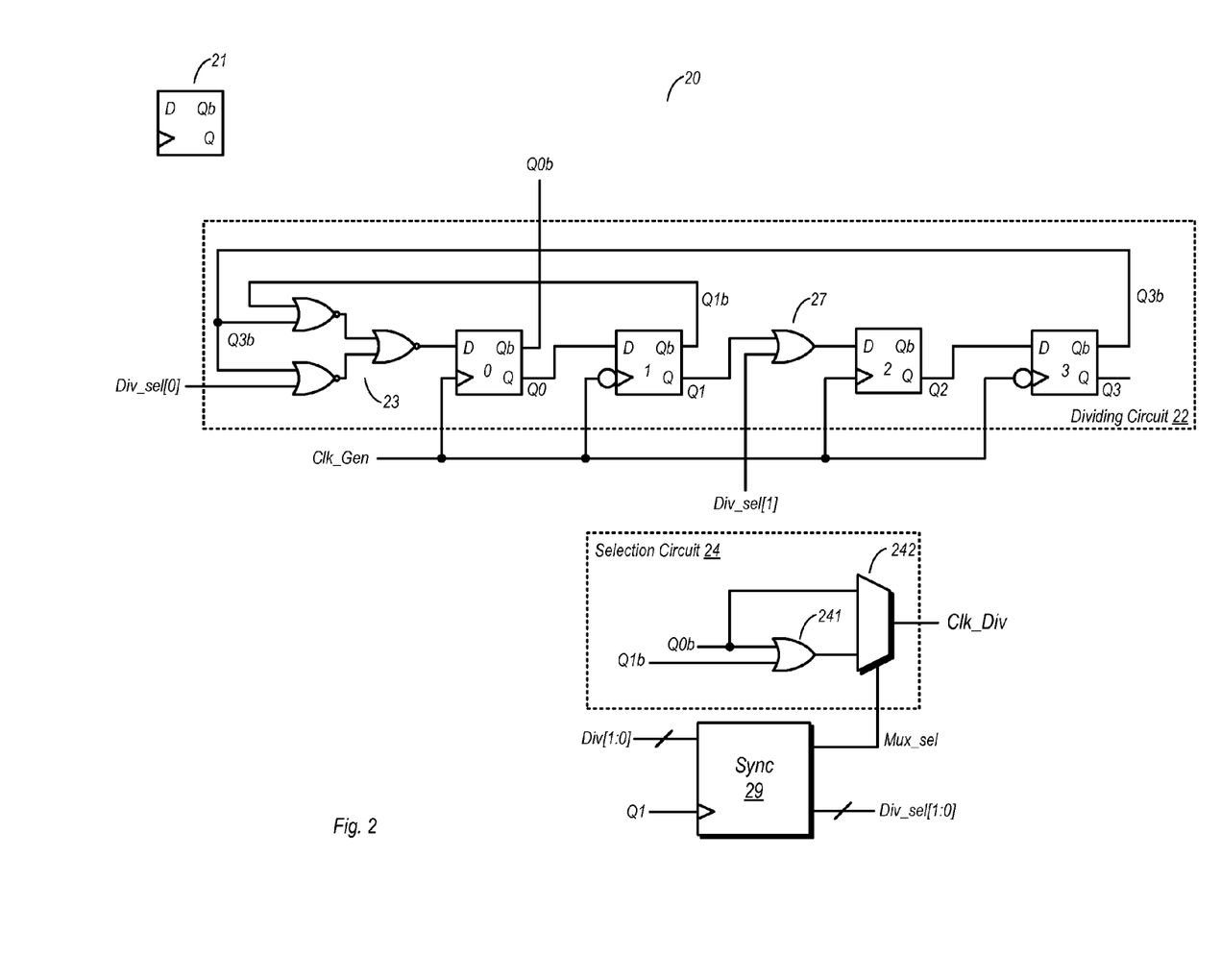
FIG. 2 is a logic diagram illustrating one embodiment of a clock divider.

FIG. 2 is a diagram of one embodiment of a clock divider circuit. In the embodiment shown, clock divider 20 includes three main components, a dividing circuit 22, a selection circuit 24, and a synchronizer 29. In this particular embodiment, clock divider 20 may divide the frequency of a received clock signal by integer values of two, three, or four. That is, the frequency of the output clock signal may be one half, one third, or one fourth that of the frequency of the input clock signal. Furthermore, clock divider 20 in the embodiment shown is designed such that switching between divisors may be performed without inducing glitches that can cause adverse effects to circuits receiving the output clock signal.

Dividing circuit 22 in the embodiment shown includes two pairs of latches 21. A first pair of latches 21 includes latch 0 and latch 1, while a second pair includes latch 2 and latch 3. Logic circuitry 23 is coupled to provide an input signal to the D input of latch 0. Logic circuitry 27 includes one input coupled to the Q output of latch 1, and an output coupled to the D input of latch 2.

Dividing circuit 22 is coupled to receive the input clock signal, which is labeled here as Clk_Gen. Latches 0 and 2 are arranged such that they are transparent when the Clk_Gen is high, while latches 1 and 3 are transparent when Clk_Gen is low. Divider circuit 22 is also coupled to receive divisor select signals, Div_sel[1:0], from synchronization circuit 29. Based on the input clock signal and the divisor select signals, dividing circuit 22 may generate a number of different periodic signals, some of which are provided to selection circuit 24 and synchronization circuit 29.

Logic circuitry 23 in the embodiment shown includes three different two-input NOR gates, arranged in a staged configuration. Two of these NOR gates are coupled to receive the complementary output, Q3B, from latch 3. One of the NOR gates is coupled to receive the complemented output Q1B from latch 1, while another one of the NOR gates is coupled to receive one of the divisor select signals, Div_sel[0]. The third NOR gate is coupled to receive the outputs of the first two, and is further coupled to provide an output to the D input of latch 0. Latch 0 in turn is coupled to provide its Q output, Q0, to the D input of latch 1.

The output of latch 1 is coupled to one of the inputs of logic circuitry 27, which is implemented in this embodiment as a single, two-input OR gate. The other input is the second divisor select signal, Div[1]. The output of this OR gate is coupled to the D input of latch 2. The output of latch 2 is in turn coupled to the D input of latch 3.

Selection circuit 24 in the embodiment shown includes an OR gate 241 and a multiplexer 242. Selection circuit 24 is coupled to receive the complementary outputs of latches 0 and 1, Q0b and Q1b, respectively, and a selection signal, Mux_sel, from synchronization circuit 29. Multiplexer 242 is a two-input multiplexer coupled to receive Q0b on its first input and the output of OR gate 241 on its second input. The output of multiplexer 242 is the output clock signal, Clk_Div, of clock divider 20. In this particular embodiment, synchronization circuit 29 is configured to cause multiplexer 242 to select Q0b to be passed as the output clock signal during divide by two and divide by four operations, and the output of OR gate 241 during divide by three operations.

Synchronization circuit in the embodiment shown is configured to receive divisor control signals Div[1:0], and may generate the divisor select signals Div_Sel[1:0] based thereon. Synchronization circuit 29 also includes a clock input that is coupled to receive the true output from latch 1, Q1. The signal output from Q1 of latch 1 is used by this embodiment of synchronization circuit 29 to synchronize generation of the multiplexer select signal and the divisor select signals. As will be discussed further below, synchronization circuit 29 is configured to generate the multiplexer selection signal responsive to a rising edge of Q1 and the divisor select signals responsive to a falling edge of Q1. More particularly, the multiplexer select signal may be asserted on a rising edge that is of Q1 just prior to the next falling edge thereof, upon which the divisor select signals are generated. Generating the multiplexer and divisor select signals in this manner may result in glitch-free switching between divisors while enabling clock divider 20 to output a clock signal with a 50% duty cycle.

As previously noted, dividing circuit 22 may generate a number of periodic signals, including Q0, Q0b, Q1, Q1b, and so forth. Generally speaking, the outputs of latch 0 and latch 1 may be periodic irrespective of the divisor. Signals from Q2 and Q3b may be periodic depending on the state of Div_sel [1]. If Div_sel[1] is a logic 0, the output of the OR gate implementing logic circuitry 27 varies with the output of Q1. Accordingly, Q2 and Q3b will be periodic in this situation, with the periodic Q3b being fed back to logic circuitry 23. On the other hand, if Div_sel[1] is a logic 1, Q3 is held steady as a logic 1 while Q3b is held at a logic 0. This particular combination occurs only during a divide-by-two operation in this particular embodiment. The states of the divisor select signals for the various divide operations are shown below in Table 1.

TABLE 1

| Sel<1:0> | Mode |
|---|---|
| <00>$_b$ | Divide-by-4 |
| <01>$_b$ | Divide-by-3 |
| <10>$_b$ | Unwanted |
| <11>$_b$ | Divide-by-2 |

Figure 3:
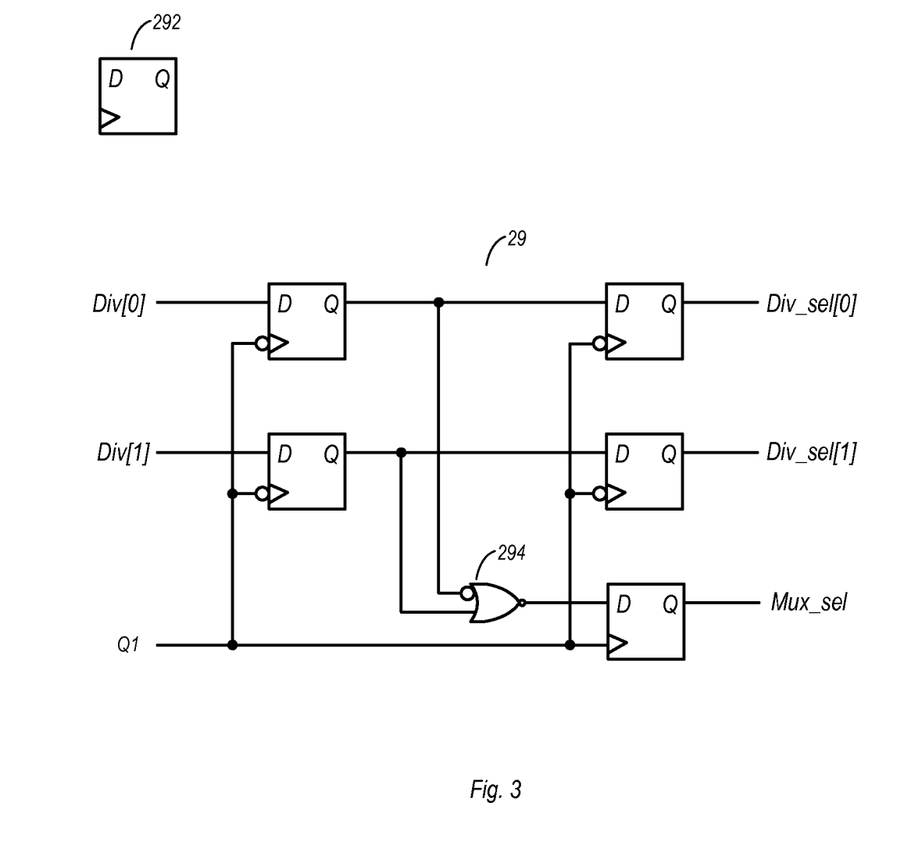
FIG. 3 is a logic diagram illustrating one embodiment of a synchronization circuit used in the clock divider of FIG. 2.

Turning now to FIG. 3, a logic diagram of one embodiment of a synchronization circuit 29 is shown. In this particular embodiment, synchronization circuit 29 comprises a number of D-type flip-flops 292 and a logic circuit 294. Each of the flip-flops 29 is coupled to receive Q1 (from latch 1 of dividing circuit 22) as a clock signal. Four of these flip-flops 292 change output states responsive to a falling edge of Q1, while one of the flip-flops 292 changes its output state responsive to the rising edge of Q1.

Synchronization circuit 29 is coupled to receive the Div[0] and Div[1] signals on first and second flip-flops 292, respectively. Third and fourth flip-flops 292 are configured to generate the divisor select signals Div[0] and Div[1], respectively. A fifth flip-flop 292, which is triggered by the rising edge of Q1, is configured to generate the multiplexer select signal.

Logic gate 294 in the embodiment shown is a NOR gate with an inverted input received from the first flip-flop 292. Synchronization circuit 29 is configured to output Mux_sel as a logic 0 during divide-by-two and divide-by-four operations. Accordingly, logic gate 294 outputs a logic 0 during divide-by-two and divide-by-four operations. Moreover, switching of the state of Mux_sel in this embodiment occurs only on a transition to or from a divide-by-three operation. Thus, since the fifth flip-flop 292 is configured to change states only on the rising edge of Q1, state changes to Mux_sel occur on the rising edge of Q1 prior to state changes of the divisor select signals, Div_sel[0] and Div_sel[1] on the next falling edge. It is further noted that in the arrangement shown, changes to the states of the divisor select signals occur one full cycle of Q1 subsequent to changes of the divisor control signals, Div[0] and Div[1]. Thus, Mux_sel changes states within the cycle of Q1 occurring subsequent to state changes of Div[0] and Div [1], and, within the cycle of Q1, prior to changes of Div_sel[0] and Div_sel[1].

Figure 4:
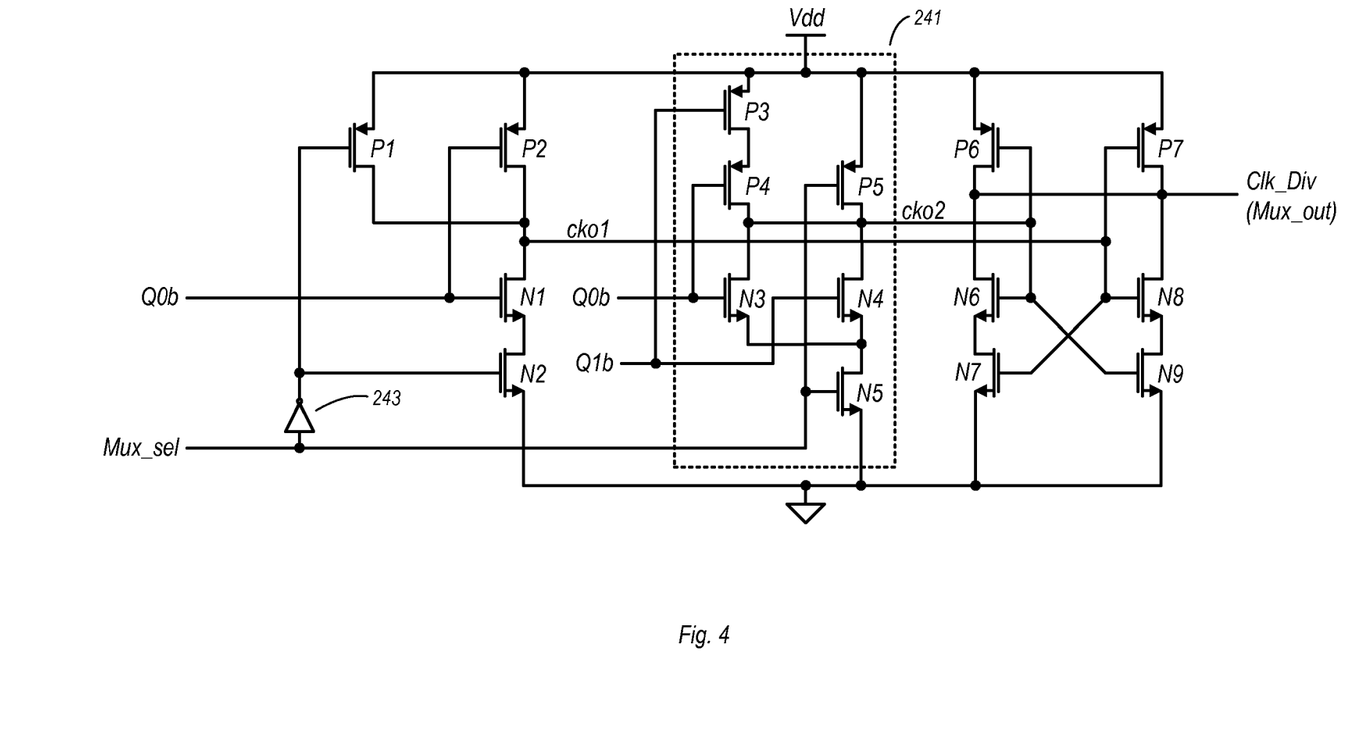
FIG. 4 is a schematic diagram illustrating one embodiment of a multiplexer used in the clock divider of FIG. 2.

FIG. 4 is a schematic diagram of one embodiment of a selection circuit 24. In the embodiment shown, selection circuit 24 is implemented using a number of PMOS (p-channel metal oxide semiconductor) transistors, namely P1-P7, and a number of NMOS (n-channel metal oxide semiconductor) transistors, namely N1-N9. As noted above in the discussion of FIG. 2, selection circuit 24 includes an OR gate 241, which is implemented here with two inverters, the first comprising P3, P4, and N3, the second comprising P5, N4, and N5. This may reduce power supply induced jitter relative to embodiments utilizing additional inverters, as jitter tends to increase when more inverters are used.

The output of OR gate 241 is Q0b OR Q1B, or equivalently, Q0 AND Q1. The output node of OR gate 241 is cko2. The signal on node cko1 in the embodiment shown is a delayed version of the Q0 signal. Depending on the Mux_sel signal, the output node Clk_Div provides a clock signal depending on either cko1 or cko2. When Mux_sel is low, transistor P5 is turned on and thus cko2 is pulled high. Meanwhile, transistor N2 is turned on from the output of inverter 243. Thus, cko1 will follow Q0 due to the Q0b input to N1 and P2. If Q0b is low, P2 is activated to pull cko1 high, which in turn causes activation of N8 and N7 (with N6 and N9 active due to the high on cko2). Accordingly, a pulldown path is provided between Clk_Div and ground. When Q0b transitions high, N2 is activated, and cko1 is pulled low. As a result of the low on cko1, P7 is activated and Clk_Div is pulled high.

If Mux_Sel is high, the output of inverter 243 is low, thereby activating P1 and pulling cko1 high, irrespective of the state of Q0b. Furthermore, when cko1 is held high, transistors N7 and N8 are held active. Accordingly, the output at Clk_Div is dependent on cko2. Transistor N5 is activated responsive to the high on Mux_sel. If Q0b and Q1b are both low, P4 and P3 are activated, and thus cko2 is pulled high. The high on cko2 results in activation of N9, thereby providing a pulldown path between Clk_Div and ground. If either of Q0b or Q1b is high, the corresponding one of N3 or N4 is activated, and thus cko2 is pulled low. The low on cko2 causes activation of P6, thereby pulling Clk_Div high. As previously noted, synchronizer 29 in the embodiment of FIG. 2 may cause Mux_sel to be low during divide-by-two and divide-by-four operations, and thus Clk_Div is a complement of a periodic signal generated on cko1, which depends on the state of Q0b. During divide-by-three operations, Mux_sel is high, and thus Clk_Div is a complement of a periodic signal generated on cko2, which in turn is dependent on the logic function of Q0b OR Q1b.

Figure 5:
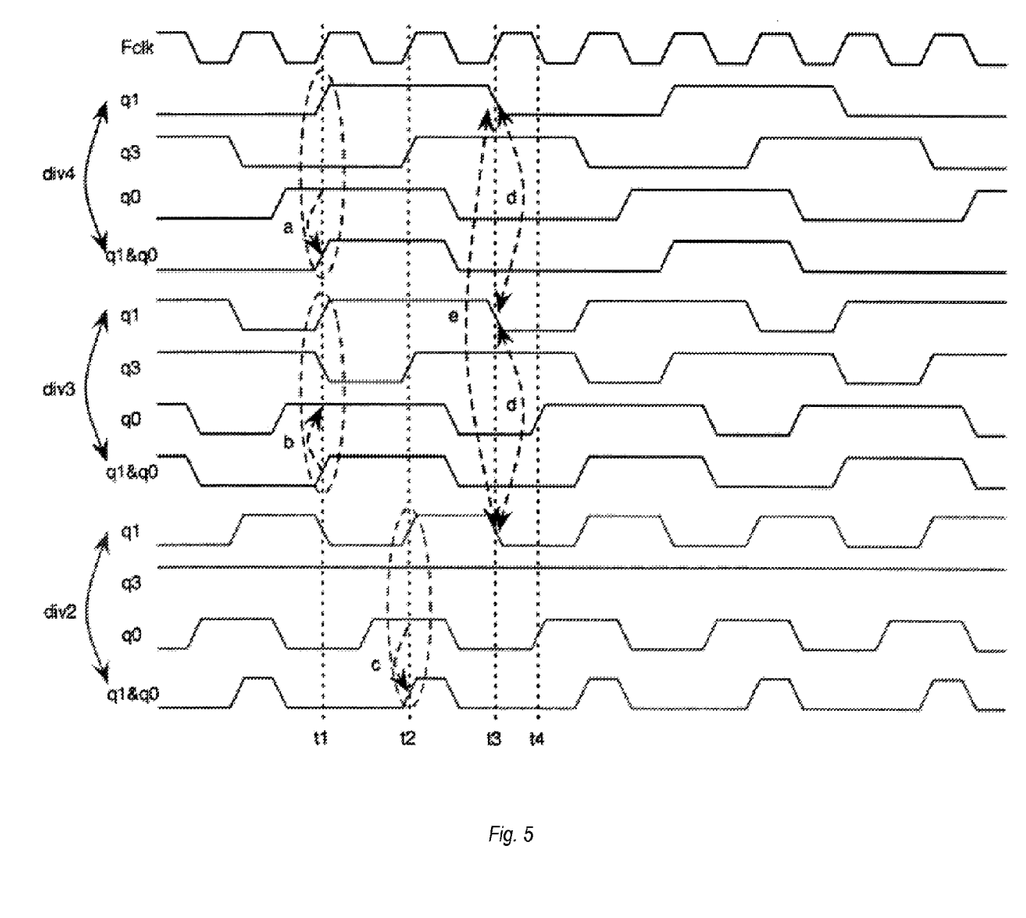
FIG. 5 is a timing diagram illustrating operation of the embodiment of the clock divider shown in FIG. 2.

Turning now to FIG. 5, a timing diagram illustrating the operation of one embodiment of clock divider 20 is shown. In particular, the timing diagram of FIG. 5 illustrates the switching times for Mux_sel and the divisor select signals, Div_sel [1:0]. As previously noted, the Mux_sel signal is generated responsive to a rising edge of Q1, prior to the generation of the Div_sel[1:0] signals on the next falling edge of Q1. In the illustrated example, when switching to a divide-by-four or divide-by-three operation, the rising edge of Q1 occurs t1. Thus, in entering divide-by-two or divide-by-three operations, any state change to Mux_sel occurs at t1. If entering a divide-by-two operation, any state change to Mux_sel occurs at t2 since this is the point in time at which the rising edge occurs. However, as previously noted, state changes to Mux_sel in the embodiment of FIG. 2 occur only when entering or exiting a divide-by-three operation. Other embodiments are possible and contemplated in which a Mux_sel state change occurs for additional or different divider operations.

For any of the divider operations for the embodiments discussed above, state changes to Div_sel[1:0] occur at t3. For each of the operations illustrated in FIG. 5, a falling edge of Q4 occurs at t3. Furthermore, this falling edge occurs subsequent to the rising edges that occur at either t1 or (divide-by-four and divide-by-three) or t2 (divide-by-two). Thus, by switching the Mux_sel signal at t1 or t2 and the divisor select signals at t3, switching may occur without causing glitches or disturbing the clock signal. Moreover, the output clock signal from clock divider 20 may be provided with a 50% duty cycle both prior to and subsequent to the switch of divisors. It is noted that for divide-by-two and divide-by-four operations, the output clock signal, Clk_Div, is equivalent to Q1 as shown in FIG. 5. For divide-by-three operations, the output clock signal is equivalent to Q1 AND Q0 (Q1*b* OR Q0*b*).

Figure 6:
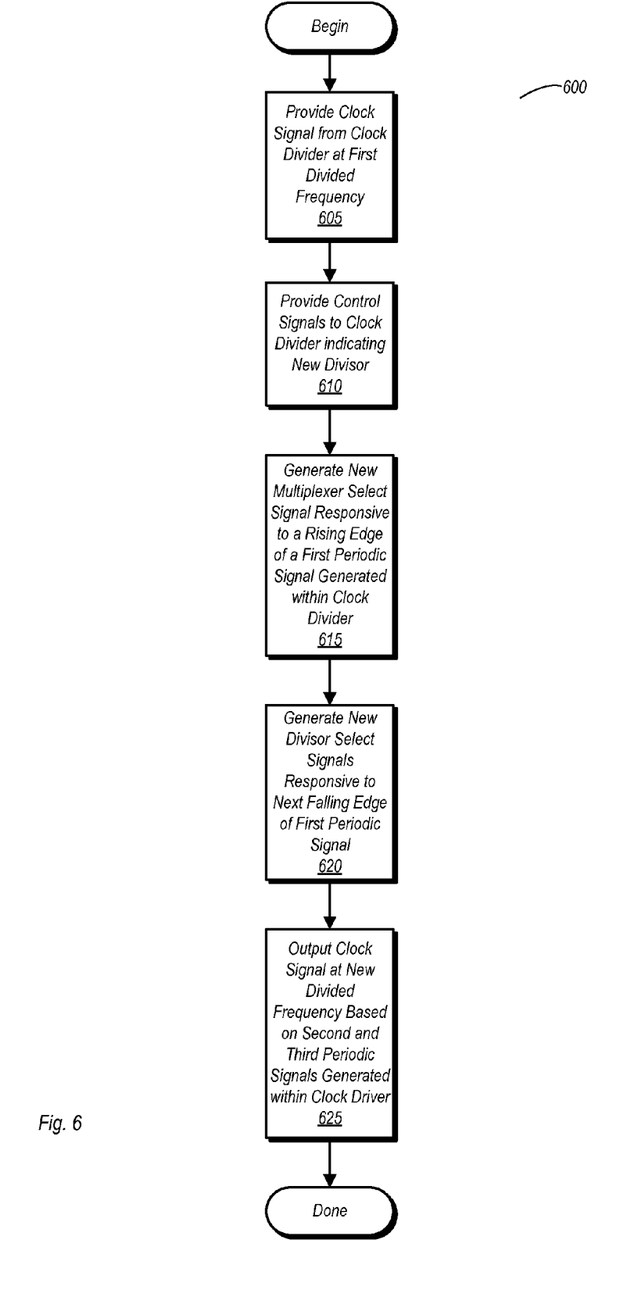
FIG. 6 if a flow diagram illustrating one embodiment of a method for operating a clock divider.

Turning now to FIG. 6, a flow diagram of one embodiment of a method for operating a clock divider circuit is shown. Method 600 may be performed with various embodiments of the hardware/circuits discussed above. Furthermore, other embodiments of circuitry/hardware that may perform method 600 are also possible and contemplated.

Method 600 begins with the providing of a clock signal from a clock divider at a first divided frequency (block 605). The first divided frequency may be a value the frequency of an input clock signal divided by a divisor indicated by control signals provided to the divider. In one embodiment, the divisor may be an integer value, although embodiments in which non-integer divisors are used are also possible and contemplated.

During operation, control signals may be provided to the clock divider in order to begin operation with a different divisor (block 610). The clock divider may include a selection circuit having a multiplexer and a synchronization circuit configured to generate a selection signal for the multiplexer as well as divisor selection signals. A multiplexer select signal may switch states, if necessary, responsive to a rising edge of a first periodic signal generated within the clock divider (block 615). Subsequent thereto, on the next falling edge of the first periodic signal (and responsive thereto), new divisor select signals may be generated (block 620). The output clock signal is provided at a new divided frequency based on second and third periodic signals generated within the clock divider (block 625).

Figure 7:
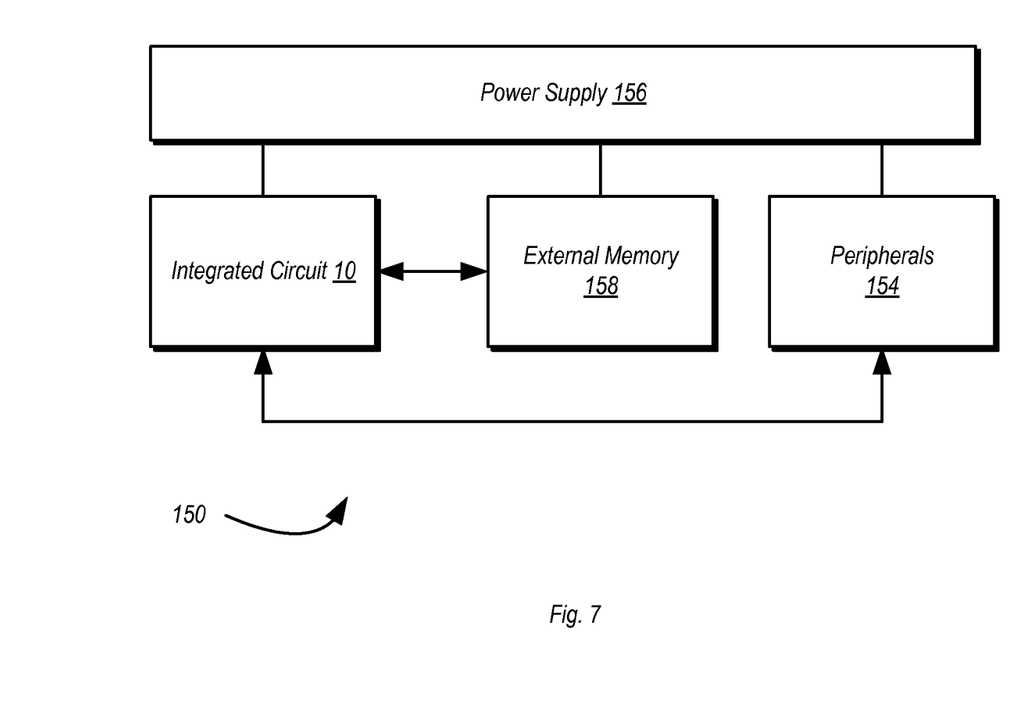
FIG. 7 is a block diagram of one embodiment of an exemplary system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:
1. A circuit comprising:
a dividing circuit coupled to receive an input clock signal and a plurality of divisor select signals, and further configured to generate a plurality of periodic signals including first, second, and third periodic signals;
a synchronization circuit coupled to receive a first periodic signal from the dividing circuit, wherein the synchronization circuit is configured to receive input control signals and further configured to generate the divisor select signals responsive to a falling edge of the first periodic signal and a multiplexer select signal responsive to a rising edge of the first periodic signal; and
a selection circuit coupled to receive the second and third periodic signals and the multiplexer select signal, wherein the selection circuit is configured to provide an output clock signal based on at least one of the second and third periodic signals and the multiplexer select signal, wherein a frequency of the input clock signal is an integer multiple of a frequency of the output clock signal.

2. The circuit as recited in claim 1, wherein the dividing circuit includes a first pair of serially-coupled latches and a second pair of serially-coupled latches, and further includes first logic circuitry coupled to an input of the first pair of serially-coupled latches and second logic circuitry coupled between an output of the first pair of serially-coupled latches and an input to the second pair of serially-coupled latches.

3. The circuit as recited in claim 2, wherein each latch of the first and second pairs of serially-coupled latches is configured to receive the input clock signal.

4. The circuit as recited in claim 2, wherein the first pair of serially-coupled latches includes a first latch and a second latch, and wherein the first latch is configured to generate the second and third periodic signals, and wherein the second latch is configured to generate the first periodic signal.

5. The circuit as recited in claim 4, wherein the second pair of serially-coupled latches includes a third latch and a fourth latch, wherein the second logic circuitry is coupled to receive the first periodic signal from the second latch, and wherein the first logic circuitry is coupled to receive a fourth periodic signal from the fourth latch and the second periodic signal from the second latch.

6. The circuit as recited in claim 2, wherein the first logic circuitry is coupled to receive a first one of the divisor select signals from the synchronization circuit, and wherein the second logic circuitry is coupled to receive a second one of the divisor select signals from the synchronization circuit.

7. The circuit as recited in claim 1, wherein the selection circuit includes a multiplexer and an OR gate, wherein a first input of the multiplexer is coupled to receive the third periodic signal, and wherein the OR gate is coupled to receive as inputs the second and third periodic signals, wherein a second input of the multiplexer is coupled to receive an output from the OR gate.

8. The circuit as recited in claim 7, wherein the synchronization circuit is configured to select the first input of the multiplexer if the input control signals indicate a divide by two or divide by four operation, and wherein the synchronization circuit is further configured to select the second input of the multiplexer if the input control signals indicate a divide by three operation.

9. The circuit as recited in claim 1, wherein the synchronization circuit includes:
    a first flip-flop coupled to receive a first one of the input control signals;
    a second flip-flop coupled to receive a second one of the input control signals;
    a third flip-flop configured to output a first one of the divisor select signals;
    a fourth flip-flop configured to put a second one of the divisor select signals; and
    a fifth flip-flop configured to output the multiplexer select signal.

10. The circuit as recited in claim 9, wherein the first, second, third, and fourth flip-flops are configured to switch states responsive to falling edge of the first periodic signal, and wherein the fifth flip-flop is configured to switch states responsive to a rising edge of the first periodic signal.

11. A method comprising:
    generating, using a divider circuit, first, second, and third periodic signals based on an input clock signal and a plurality of divisor select signals;
    generating the divisor select signals and a multiplexer select signal, using a synchronization circuit, based on the first periodic signal and input control signals, wherein the divisor select signal is generated responsive to a falling edge of the first periodic signal, and wherein the multiplexer select signal is generated responsive to a rising edge of the first periodic signal;
    receiving, at a selection circuit, the second and third periodic signal and the multiplexer select signal; and
    providing an output clock signal from a selection circuit based on at least one of the second and third periodic signals and the multiplexer select signal, wherein a frequency of the input clock signal is an integer multiple of a frequency of the output clock signal.

12. The method as recited in claim 11, wherein the divider circuit includes first and second pairs of serially-coupled latches, wherein the method further comprises:
    a first one of the first pair of serially-coupled latches generating the third periodic signal; and
    a second one of the first pair of serially coupled latches generating the first and second periodic signals.

13. The method as recited in claim 11, wherein the selection circuit includes a multiplexer and an OR gate, and wherein the method further comprises:
    providing the third periodic signal to a first input of a multiplexer;
    providing the second and third periodic signals to inputs of the OR gate;
    providing an output of the OR gate to a second input of the multiplexer;
    selecting the first input of the multiplexer if the input control signals indicate a divide by two or divide by four operation; and
    selecting the second input of the multiplexer if the input control signals indicate a divide by three operation.

14. The method as recited in claim 11, wherein the synchronization circuit includes first, second, third, fourth, and fifth flip-flops, and wherein the method further comprises:
    providing a first one of the input control signals to the first flip-flop;
    providing a second one of the input control signals to the second flip-flop;
    generating a first one of the divisor select signals from the third flip-flop based on an output signal received from the first flip-flop;
    generating a second one of the divisor select signals from the fourth flip-flop based on an output signal received from the second flip-flop; and
    generating the multiplexer select signal from the fifth flip-flop based on the output signal from the first flip-flop and the output signal from the second flip-flop.

15. The method as recited in claim 14, further comprising:
    changing states of the first, second, third, and fourth flip-flops responsive to a falling edge of the first periodic signal; and
    changing states of the fifth flip-flop responsive to a rising edge of the first periodic signal.

16. An integrated circuit comprising:
    a clock generation circuit configured to generate a first clock signal;
    a clock divider circuit coupled to receive the first clock signal and configured to output a second clock signal, wherein a frequency of the first clock signal is an integer multiple of the second clock signal, and wherein the clock divider circuit includes:
        a dividing circuit coupled to receive an input clock signal and a plurality of divisor select signals, and further configured to generate a plurality of periodic signals including first, second, and third periodic signals;
        a synchronization circuit coupled to receive a first periodic signal from the dividing circuit, wherein the synchronization circuit is configured to receive input control signals and further configured to generate the divisor select signals responsive to a falling edge of the first periodic signal and a multiplexer select signal responsive to a rising edge of the first periodic signal; and
        a selection circuit coupled to receive the second and third periodic signals and the multiplexer select signal, wherein the selection circuit is configured to provide an output clock signal based on at least one of the second and third periodic signals and the multiplexer select signal, wherein a frequency of the input clock signal is an integer multiple of a frequency of the output clock signal; and
    a plurality of synchronous circuits coupled to receive the second clock signal.

17. The integrated circuit as recited in claim 16, wherein the synchronization circuit includes:
    a first flip-flop coupled to receive a first one of the input control signals;
    a second flip-flop coupled to receive a second one of the input control signals;
    a third flip-flop configured to output a first one of the divisor select signals;
    a fourth flip-flop configured to put a second one of the divisor select signals; and
    a fifth flip-flop configured to output the multiplexer select signal.

18. The integrated circuit as recited in claim 17, wherein the first, second, third, and fourth flip-flops are configured to switch states responsive to falling edge of the first periodic signal, and wherein the fifth flip-flop is configured to switch states responsive to a rising edge of the first periodic signal.

19. The integrated circuit as recited in claim 16, wherein the selection circuit includes a multiplexer and an OR gate, wherein a first input of the multiplexer is coupled to receive the third periodic signal, and wherein the OR gate is coupled to receive as inputs the second and third periodic signals, wherein a second input of the multiplexer is coupled to receive an output from the OR gate.

20. The integrated circuit as recited in claim 19, wherein the synchronization circuit is configured to select the first input of the multiplexer if the input control signals indicate a divide by two or divide by four operation, and wherein the synchronization circuit is further configured to select the second input of the multiplexer if the input control signals indicate a divide by three operation.

* * * * *